US009376752B2

(12) United States Patent
Goel et al.

(10) Patent No.: US 9,376,752 B2
(45) Date of Patent: Jun. 28, 2016

(54) EDGE RING FOR A DEPOSITION CHAMBER

(71) Applicant: Applied Materials, Inc., Santa Clara, CA (US)

(72) Inventors: Ashish Goel, Bangalore (IN); Anantha Subramani, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/789,222

(22) Filed: Mar. 7, 2013

(65) Prior Publication Data
US 2013/0264035 A1 Oct. 10, 2013

Related U.S. Application Data

(60) Provisional application No. 61/621,185, filed on Apr. 6, 2012.

(51) Int. Cl.
| C23C 16/458 | (2006.01) |
| C23C 14/50 | (2006.01) |
| H01J 37/34 | (2006.01) |
| H01L 21/67 | (2006.01) |
| H01L 21/687 | (2006.01) |
| C23C 14/56 | (2006.01) |
| C23C 14/54 | (2006.01) |

(52) U.S. Cl.
CPC ............. *C23C 16/4585* (2013.01); *C23C 14/50* (2013.01); *C23C 14/541* (2013.01); *C23C 14/564* (2013.01); *H01L 21/67115* (2013.01); *H01L 21/68735* (2013.01); *H01J 37/3408* (2013.01); *H01J 37/3441* (2013.01)

(58) Field of Classification Search
CPC ................... H01L 21/68721; H01L 21/68735; C23C 16/4585; C23C 14/564; C23C 14/50; C23C 14/541; H01J 37/3408; H01J 37/3441
USPC ................. 118/500, 728; 204/298.15, 298.11
See application file for complete search history.

(56) References Cited

U.S. PATENT DOCUMENTS 6,344,105 B1 2/2002 Daugherty et al.
6,482,301 B1 11/2002 Chen et al.
(Continued)

FOREIGN PATENT DOCUMENTS

KR 20070021521 A 2/2007
KR 20070025092 A 3/2007

OTHER PUBLICATIONS

International Search Report, PCT Application: PCT/US2013/030948, dated Jun. 28, 2013.

*Primary Examiner* — Michael Band
(74) *Attorney, Agent, or Firm* — Patterson & Sheridan, LLP

(57) ABSTRACT

Disclosed are apparatus and methods for material and thermal processing of substrates in a single chamber. In one embodiment, an edge ring is provided. The edge ring includes an annular body having an inner peripheral edge, a first surface, and a second surface opposite the first surface, a first raised member extending substantially orthogonally from the second surface, a second raised member extending from the second surface adjacent the first raised member and separated from the first raised member by a first depression, and a third raised member extending from the second surface adjacent the second raised member and separated by a second depression, the second depression comprising a sloped surface having a reflectivity value that is different than a reflectivity value of the first surface.

18 Claims, 3 Drawing Sheets

(56) References Cited

U.S. PATENT DOCUMENTS

| | | | |
|---|---|---|---|
| 6,620,736 B2 * | 9/2003 | Drewery | 438/710 |
| 6,623,597 B1 * | 9/2003 | Han et al. | 156/345.51 |
| 7,670,436 B2 * | 3/2010 | Miller et al. | 118/728 |
| D665,071 S | 8/2012 | Goel et al. | |
| D665,491 S | 8/2012 | Goel et al. | |
| 2003/0015421 A1 | 1/2003 | Cha et al. | |
| 2004/0137398 A1 | 7/2004 | Goodman | |
| 2009/0050272 A1 * | 2/2009 | Rosenberg et al. | 156/345.51 |
| 2009/0308739 A1 | 12/2009 | Riker et al. | |
| 2011/0049100 A1 | 3/2011 | Han et al. | |

\* cited by examiner

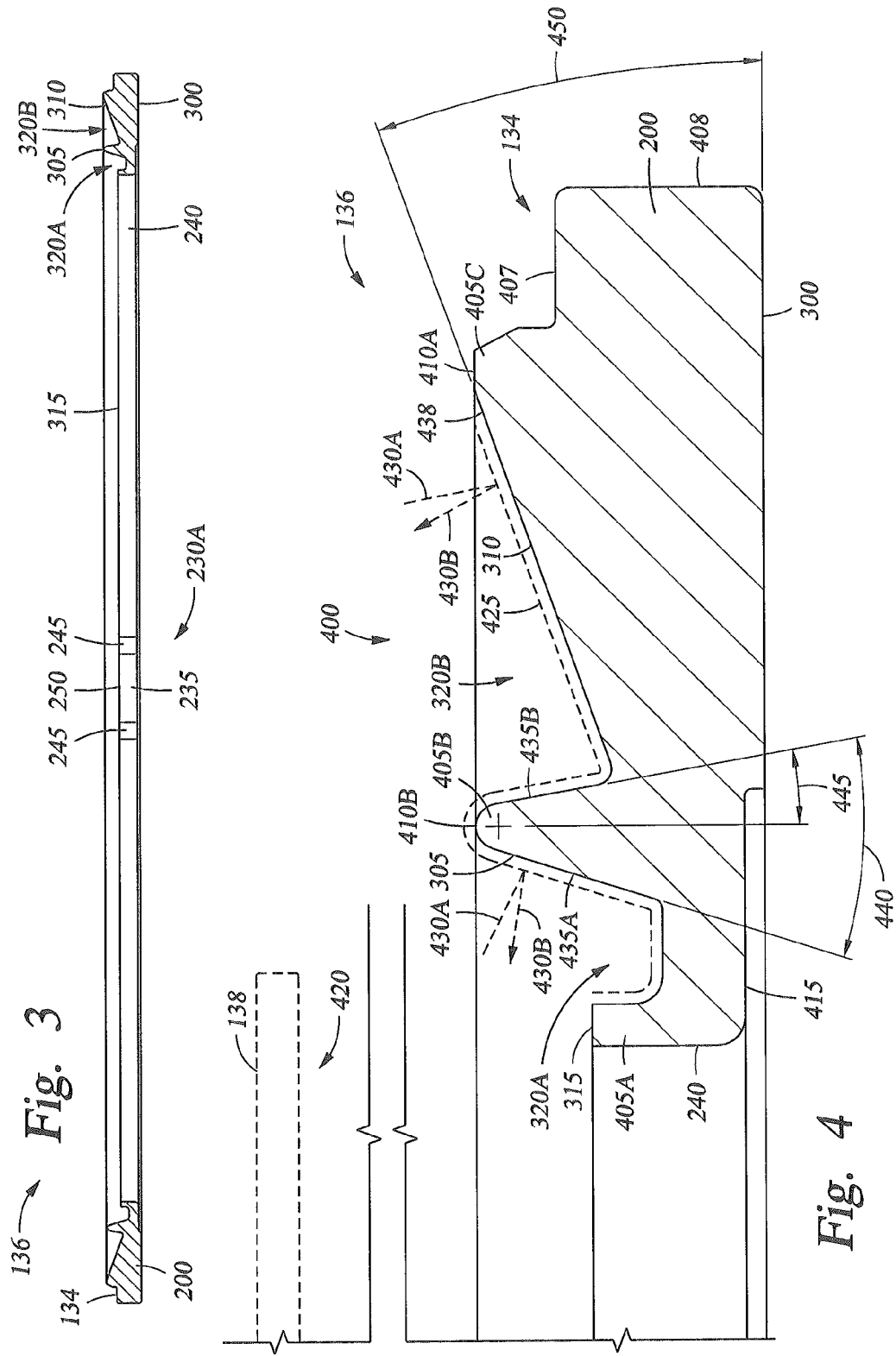

EDGE RING FOR A DEPOSITION CHAMBER

CROSS REFERENCE TO RELATED APPLICATIONS

This application claims benefit of U.S. Provisional Patent Application Ser. No. 61/621,185, filed Apr. 6, 2012, which is hereby incorporated by reference herein.

FIELD

Embodiments disclosed herein relate to semiconductor processing. More specifically, embodiments disclosed herein relate to apparatus and methods for material and thermal processing of semiconductor substrates.

BACKGROUND

Material processes and thermal processes are common in semiconductor manufacturing in order to fabricate electronic devices on a substrate. In an electronic device fabrication process, semiconductor substrates are often subjected to a material process which includes deposition, implantation, or etching, and a thermal process may be performed before, during or after the material process. In some thermal processes, substrates are heated utilizing radiant sources, such as lamps, that direct radiant energy to the substrate to heat previously deposited material, anneal, and/or perform a rapid thermal process (RTP) on the substrate after a material process. However, the thermal process is typically performed in a separate chamber, which requires transfer of the substrate to another chamber. During the material process the substrate may be heated. However, much of the heat energy contained in the substrate may be lost to chamber components and transfer devices, such as robot blades, which reduces efficiency of the device fabrication process and increases process time. Machine utilization, the time a machine is operating to process a substrate, is a critical factor in reducing the cost of each chip produced. Thus, there is a continuing need for more efficient semiconductor device fabrication processes and apparatus.

SUMMARY

Disclosed are apparatus and methods for material and thermal processing of substrates in a single chamber. In one embodiment, an edge ring is provided. The edge ring includes an annular body having an inner peripheral edge, a first surface, and a second surface opposite the first surface, a first raised member extending substantially orthogonally from the second surface, a second raised member extending from the second surface adjacent the first raised member and separated from the first raised member by a first depression, and a third raised member extending from the second surface adjacent the second raised member and separated by a second depression, the second depression comprising a sloped surface having a reflectivity value that is different than a reflectivity value of the first surface, the sloped surface configured to direct optical energy radially inward.

In another embodiment, an edge ring is provided. The edge ring includes an annular body having an inner peripheral edge, a first surface, and a second surface opposite the first surface, a first raised member extending from the second surface defining a planar surface adjacent the inner peripheral edge, a second raised member extending from the second surface radially outward of the first raised member and separated from the first raised member by a first depression, a third raised member extending from the second surface radially outward of the second raised member and separated by a second depression, and a recessed flange disposed radially outward of the third raised member, the recessed flange comprising a surface that is parallel to a plane of the first surface and substantially orthogonal to an outer peripheral surface of the body.

In another embodiment, an edge ring is provided. The edge ring includes an annular body having an inner peripheral edge, a first surface, and a second surface opposite the first surface, a first raised member extending orthogonally from the second surface defining a planar surface adjacent the inner peripheral edge that is substantially parallel to the first surface, a second raised member extending from the second surface radially outward of the first raised member and separated from the first raised member by a first depression, the second raised member having a first side and a second side, a third raised member extending from the second surface radially outward of the second raised member and separated by a second depression, the second depression comprising a tapered planar surface disposed in a plane having an angle that is substantially normal to a surface of the second side of the second raised member, and a recessed flange disposed radially outward of the third raised member, the recessed flange comprising a surface that is substantially orthogonal to an outer peripheral surface of the body.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a cross-sectional view of the body of the edge ring along section lines 3-3 of FIG. 2.

FIG. 4 is an enlarged cross-sectional view of a portion of the body of the edge ring shown in FIG. 3.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
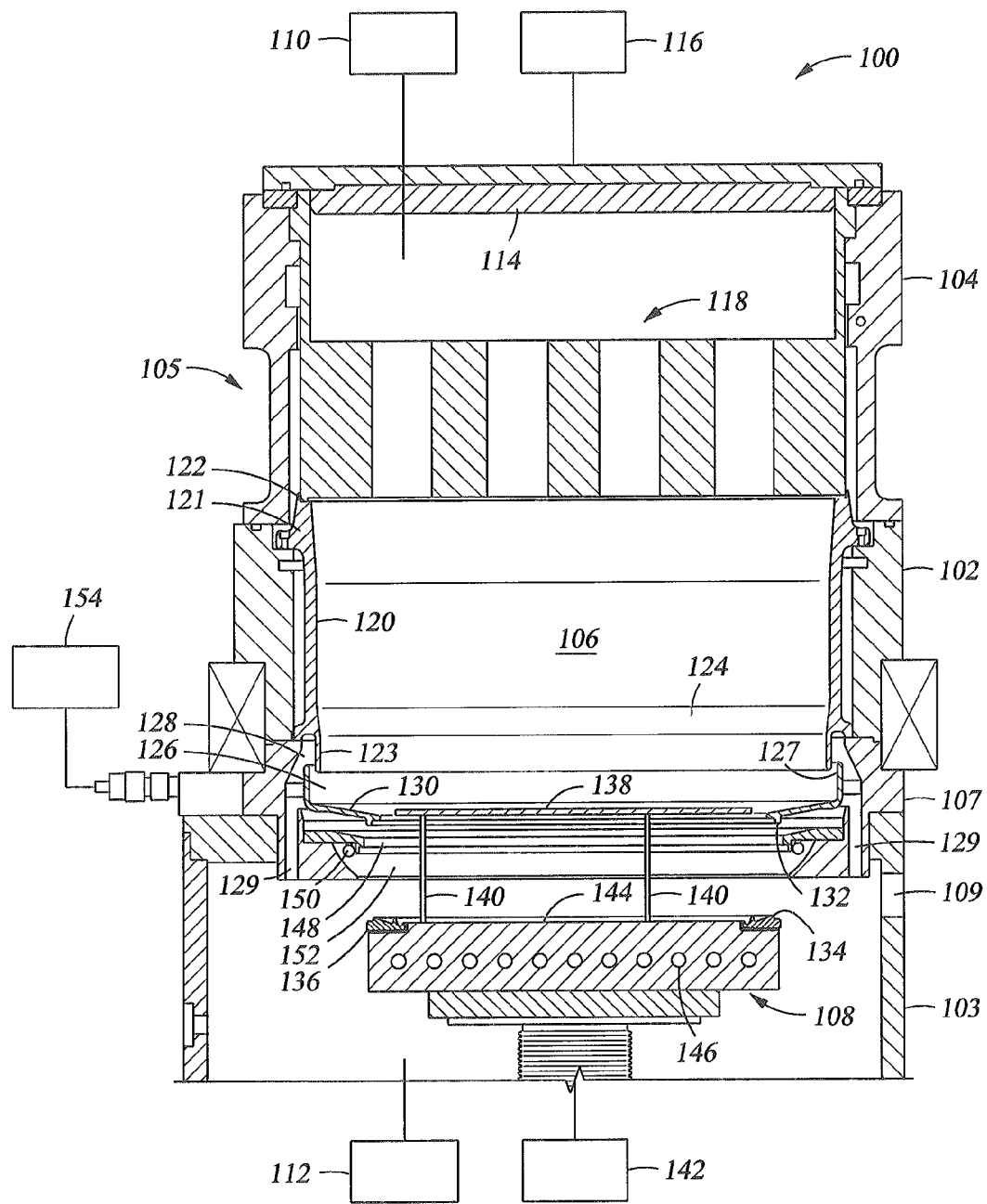
FIG. 1 is a schematic cross-sectional view of a chamber according to one embodiment.

FIG. 1 is a schematic cross-sectional view of a deposition chamber 100 according to one embodiment. The deposition chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the deposition chamber 100. A substrate transfer port 109 is formed in the lower sidewall 103 for transferring substrates into and out of the interior volume 106.

In one embodiment, the deposition chamber 100 comprises a sputtering chamber, also known as a physical vapor deposition (PVD) chamber, capable of depositing, for example, titanium, aluminum oxide, aluminum, copper, tantalum, tantalum nitride, tungsten, or tungsten nitride on a substrate. Examples of suitable PVD chambers include the ALPS® Plus and SIP ENCORE® PVD processing chambers, both commercially available from Applied Materials, Inc., Santa Clara, of Calif. It is contemplated that processing chambers available from other manufactures may also utilize the embodiments described herein.

In a deposition process, process gases may be flowed to the interior volume 106 from a gas source 110. The pressure of the interior volume 106 may be controlled by a pumping device 112 in communication with the interior volume 106. The lid portion 104 may support a sputtering source 114, such as a target. The sputtering source 114 may be coupled to a source assembly 116 comprising magnets and a power supply for the sputtering source 114. A collimator 118 may be positioned in the interior volume 106 between the sputtering source 114 and the pedestal 108. A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the chamber 100. In another embodiment, the collimator 118 may be coupled to an electrical power source and/or electrically coupled to the lid portion 104 of the body 105 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the chamber adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107. Through-holes 129 are also formed in the adapter plate 107. The through-holes 129 are in fluid communication with the recess 128 to provide increased gas flow through the interior volume 106.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recessed flange 134 formed in an edge ring 136 disposed on the pedestal 108. The recessed flange 134 may be a circular groove formed in the edge ring 136. The engagement of the protrusion 132 and the recessed flange 134 centers the shield ring 126 with respect to the longitudinal axis of the pedestal 108. The substrate 138 (shown supported on lift pins 140) is centered relative to the longitudinal axis of the pedestal 108 by coordinated positioning calibration between the pedestal 108 and a robot blade (not shown). In this manner, the substrate 138 may be centered within the deposition chamber 100 and the shield ring 126 may be centered radially about the substrate 138 during processing.

In operation, a robot blade (not shown) having a substrate 138 thereon is extended through the substrate transfer port 109. The pedestal 108 may be lowered to allow the substrate 138 to be transferred to the lift pins 140 extending from the pedestal 108. Lifting and lowering of the pedestal 108 and/or the lift pins 140 may be controlled by a drive 142 coupled to the pedestal 108. The substrate 138 may be lowered onto a substrate receiving surface 144 of the pedestal 108. With the substrate 138 positioned on the substrate receiving surface 144 of the pedestal 108, sputter deposition may be performed on the substrate 138. The edge ring 136 may be electrically insulated from the substrate 138 during processing. Therefore, the substrate receiving surface 144 may include a height that is greater than a height of portions of the edge ring 136 adjacent the substrate 138 such that the substrate 138 is prevented from contacting the edge ring 136. During sputter deposition, the temperature of the substrate 138 may be controlled by utilizing thermal control channels 146 disposed in the pedestal 108.

After sputter deposition, the substrate 138 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled thereto intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 138 to heat the substrate 138 and the material deposited thereon. Reflective surfaces on the chamber components surrounding the substrate 138, such as the concave surface 152 of the adapter plate 107, serve to focus the energy toward the backside of the substrate 138 and away from other chamber components where the energy would be lost and/or not utilized. The adapter plate 107 may be coupled to a coolant source 154 to control the temperature of the adapter plate 107 during heating.

The substrate 138 may be heated to a first temperature of about 300 degrees Celsius (° C.) to about 400° C., such as about 350° C., in a few seconds. Heating of the substrate 138 to the first temperature may enable a reflow process or a silicidation process. The reflow process is utilized to reduce overhang of metal in recesses of the substrate 138. The silicidation process may be utilized to drive reactions between metal and silicon.

The through-holes 129 formed in the adapter plate 107 may also be utilized for increased gas conductance during processing. Each of the through-holes 129 may include a diameter of about 0.40 inches to about 0.55 inches and the adapter plate 107 may include about 30 to about 70 through-holes 129. During processing, flow in the gap between the reflector ring 148 and the radial flange 130 in combination with flow through the through-holes 129 provide a combined conductance value of about 14.22 at about 400° C.

The heating method described herein has advantages with respect to a metal deposition process. When metal is deposited on a substrate surface, the surface gains reflectivity. Absorption of optical and/or radiant energy is generally reduced on a metalized surface. Irradiation of the metalized surface is less effective than heating the surface opposite the metalized surface, for example the substrate back side. Improved energy absorption of silicon improves energy efficiency of the thermal treatment process, as opposed to the heating the metalized surface.

After heating the substrate to the first temperature, the substrate 138 is lowered to a position on the substrate receiving surface 144 of the pedestal 108. The substrate 138 may be rapidly cooled utilizing the thermal control channels 146 in the pedestal 108 via conduction. The temperature of the substrate may be ramped down from the first temperature to a second temperature in a matter of seconds to about a minute. The second temperature may be about room temperature, such as about 23° C. to about 30° C., for example, about 25° C. The substrate 138 may be removed from the deposition chamber 100 through the substrate transfer port 109 for further processing.

Figure 2:
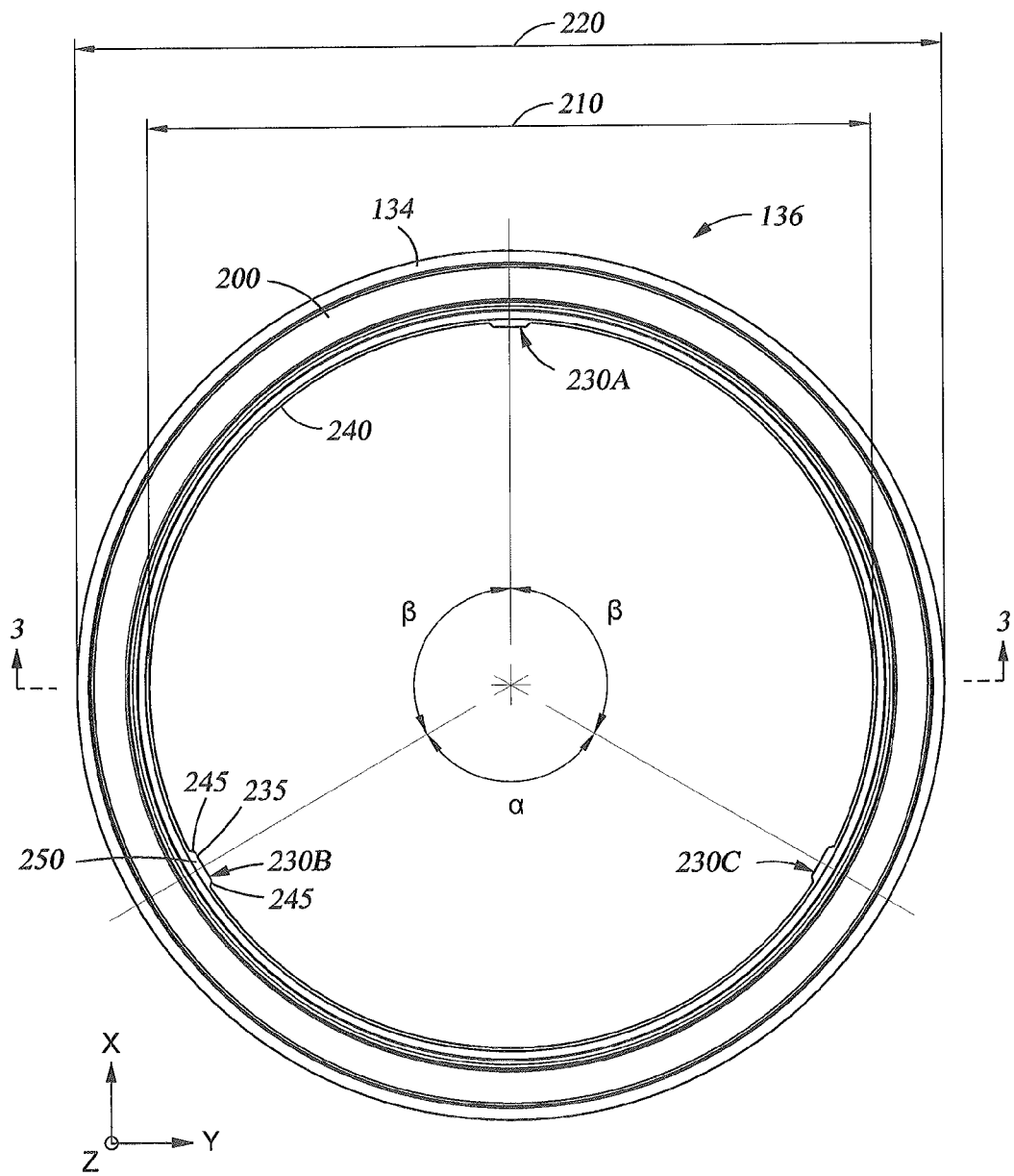
FIG. 2 is a top plan view of one embodiment of the edge ring shown in FIG. 1.

FIG. 2 is a top plan view of one embodiment of the edge ring 136 shown in FIG. 1. The edge ring 136 includes a body 200 that is annular or ring-shaped. The body 200 may be made of a ceramic material, such as aluminum oxide ($Al_2O_3$), and formed by a sintering process. The body 200 comprises an inner diameter 210 and an outer diameter 220. The inner diameter 210 is slightly less than a diameter of a substrate 138 (shown in FIG. 1) and the outer diameter 220 is greater than or equal to an outer dimension of the pedestal 108 (shown in FIG. 1).

The body 200 may include one or more extensions 230A, 230B and 230C. The extensions 230A-230C may be configured as orientation features that extend radially inward from the inner diameter 210 of the body 200. In one aspect, the extensions 230A-230C are configured to engage with mating orientation features, such as depressions or other structures (not shown) disposed on the pedestal 108 (shown in FIG. 1). The extensions 230A-230C are adapted to seat the body 200 of the edge ring 136 in a specific orientation with respect to the pedestal 108. This allows the edge ring 136 to be removed from the pedestal 108 for cleaning or replacement, and installation on the pedestal 108 while assuring proper alignment between the edge ring 136 and the pedestal 108. Each of the extensions 230A-230C include a circumferential face 235 that extends radially inward from an inner peripheral surface 240 of the body 200. The circumferential face 235 interfaces with the body 200 by a transition surface 245 on each side of the circumferential face 235. The transition surfaces 245 may be a sharp corner or a contoured surface, such as a beveled, rounded or tapered surface. Each of the extensions 230A-230C may also include an upper surface 250 that is coplanar with the body 200 of the edge ring 136. The upper surface 250 may be substantially planar and the circumferential face 235 may extend downwardly (in the Z direction) at about 90 degrees from the plane of the upper surface 250. The circumferential face 235 may be rounded and include a radius between the transition surfaces 245 that is substantially similar to a radius of the inner peripheral surface 240 of the body 200. Alternatively, the circumferential face 235 may be flat or planar between the transition surfaces 245.

In one embodiment, each of the extensions 230A-230C are substantially equally spaced angularly along the body 200 (e.g., about 120 degrees). In another embodiment, an angle between at least two of the extensions 230A-230C, such as an angle α between the extensions 230B and 230C, is less than an angle between an adjacent extension, such as an angle β between the extension 230A and extensions 230B and 230C. For example, the angle α may be about 90 degrees to about 100 degrees, while the angle β may be about 130 degrees to about 135 degrees. The extensions 230A-230O may be utilized as indexing features to ensure the edge ring 136 is seated in a specific orientation with respect to the pedestal 108.

FIG. 3 is a cross-sectional view of the body 200 of the edge ring 136 along section lines 3-3 of FIG. 2. The body 200 comprises a first surface 300 (i.e., lower surface) and a plurality of sloped surfaces 305 and 310 opposite the first surface 300. The body 200 also includes a height dimension defined by one or both of the apexes of a first sloped surface 305 and a second sloped surface 310. A planar surface 315 is defined on an upper surface of the inner peripheral surface 240 of the body 200. The planar surface 315 may be substantially parallel with the substrate receiving surface 144 of the pedestal 108 (shown in FIG. 1). A first depression 320A is formed between the planar surface 315 and the first sloped surface 305. A second depression 320B is formed between the first sloped surface 305 and the second sloped surface 310. At least one of the first sloped surface 305 and the second sloped surface 310 define one or more reflective surfaces that may be utilized to reflect optical and/or radiant energy toward the backside of the substrate 138 (shown in FIG. 1) during a substrate heating process.

FIG. 4 is an enlarged cross-sectional view of a portion of the body 200 of the edge ring 136 shown in FIG. 3. With reference to the inner peripheral surface 240 of the body 200 and moving radially outward, the edge ring 136 comprises a second surface 400 (i.e., upper surface) defined by a first raised member 405A, a second raised member 405B and a third raised member 405C. The upper surface 400 also includes the first depression 320A provided between the first raised member 405A and the second raised member 405B, and the second depression 320B provided between the second raised member 405B and the third raised member 405C. The upper surface 400 also includes a fourth depression (recessed flange 134) that is utilized to engage with the protrusion 132 of the shield ring 126 (shown in FIG. 1) utilized to center the shield ring 126 with respect to the longitudinal axis of the pedestal 108, as described above. The third raised member 405C may comprise an apex 410A that may be substantially equal in height to an apex 410B of the second raised member 405B. The apexes 410A, 410B may be flat, as shown with apex 410A, or rounded, as shown with apex 410B. In one aspect, the recessed flange 134 comprises a surface 407 that is substantially orthogonal to an outer peripheral surface 408 of the body 200. The surface 407 may also be disposed in a plane that is substantially parallel to a plane of the apex 410A and/or a plane of the first surface 300. The first surface 300 may also include a depression 415 that extends radially inward of the inner peripheral surface 240 of the body 200.

As described above, the first raised member 405A includes the planar surface 315, which is overlapped by the substrate 138 (shown in phantom) during a sputter deposition process. However, during a heating process, such as a reflow process or a silicidation process as described above, the substrate 138 is raised above the pedestal 108 (shown in FIG. 1) and the edge ring 136, which remains on the pedestal 108. Energy from the lamps 150 disposed on the adapter plate 107 (both shown in FIG. 1) is directed toward a backside 420 of the substrate 138. Depending on the position of the substrate 138 relative to the lamps 150 and/or the adapter plate 107 during this heating process, a portion of the energy from the lamps 150 is indirectly focused radially inward toward the backside 420 of the substrate 138. The reflective surfaces on the chamber components, such as the concave surface 152 (shown in FIG. 1) of the adapter plate 107, and the one or more reflective surfaces of the edge ring 136, focus the energy toward the backside 420 of the substrate 138.

The body 200 is made of a ceramic material and typically includes an emissivity of about 0.75 to about 0.83. The second surface 400 therefore includes a coating 425 that is more reflective than the body 200 that is utilized to reflect primary energy 430A from the lamps 150 to the backside 420 of the substrate 138. The coating 425 may be a reflective metallic material, such as titanium, tantalum, tungsten, aluminum, copper, and alloys thereof or derivatives thereof, including oxides and nitrides of the metallic materials. In one embodiment, the coating 425 comprises the same material as the sputtering source 114 (FIG. 1). The coating 425 may be disposed on a portion of the first raised member 405A to the apex 410A of the third raised member, or any portion thereof. The reflectivity value of the coating 425 may be further enhanced by elevated temperatures during the heating process. In one aspect, the reflectivity value of the coating 425 is about 70 percent (%) to about 90%, depending on the angle of incidence and/or the temperature of the heating process.

In one embodiment, the coating 425 is deposited on selected portions of the edge ring 136 prior to utilizing the edge ring 136 in the deposition chamber 100 (FIG. 1) such that the planar surface 315, apex 410A, and/or the surface 407 are bare (i.e., not covered with the coating 425). The metallic material may be deposited on the second surface 400, or portions thereof, by a conventional deposition method, such as PVD or chemical vapor deposition (CVD) to form the coating 425. The second surface 400 may be blanket coated and portions that interface with other components, such as the planar surface 315 and/or the recessed flange 134 may be shielded or cleaned prior to use of the edge ring 136. Portions of the first sloped surface 305 and the second sloped surface 310 may be roughened to increase adherence of the coating 425. For example, the first sloped surface 305 and the second sloped surface 310, or portions thereof, may be roughened, by bead blasting or other process, to include an average or mean surface roughness of about 75 Ra of about 120 Ra prior to deposition of the coating 425.

In another embodiment, the coating is deposited by the sputtering source 114 (shown in FIG. 1) during a sputter deposition process on the substrate 138. In this embodiment, the planar surface 315 is shielded by the substrate 138 during the sputter deposition. The surface 407 of the recessed flange 134 receives no deposition as the recessed flange 134 is typically out of the line of sight of the sputtering source 114 and the deposition material. Further, the surface 407 may be shielded by the shield ring 126 during sputter deposition. As described above, portions of the first sloped surface 305 and the second sloped surface 310 may be roughened to increase adherence of the coating 425.

In one aspect, the first sloped surface 305 and the second sloped surface 310 include specific angles to receive primary energy 430A from the lamps 150 and provide redirected secondary energy 430B that is focused on various portions of the backside 420 of the substrate 138. For example, the second raised member 405B may include a first side 435A and a second side 435B comprising the first sloped surface 305. In one embodiment, an angle 440 between the first side 435A and the second side 435B may be about 35 degrees to about 30 degrees, or less. In one aspect, the angle 445 between the second side 435B and vertical (i.e., substantially orthogonal to the plane of the first surface 300) is about 15 degrees to about 10 degrees, or less. Likewise, the second sloped surface 310 may comprise a tapered planar surface 438 disposed at an acute angle relative to the plane of the first surface 300. In one embodiment, the plane of the tapered planar surface 438 is provided at an angle 450 relative to the plane of the first surface 300 of about 15 degrees to about 25 degrees. In one aspect, the surface of the second side 435B may be substantially normal to the plane of the tapered planar surface 438, which includes an angle of about 80 degrees to about 90 degrees. While the above described apparatus is described as in terms of specific embodiments of the invention, some aspects of the invention may be optimized based on thermal and/or on-substrate deposition uniformity considerations. For example, the angles 440, 445 and 450 may be optimized to receive primary energy 430A from the lamps 150 based on the angle of incidence of the primary energy 430A, and direct reflected secondary energy 430B at a desired incidence angle based on the geometry of the upper surface 400 relative to a known position of the substrate 138 during a thermal process. The height and/or angular orientation of the second raised member 405B may also be optimized based on film thickness uniformity.

Thus, a deposition chamber is provided for deposition of material on a first side of a substrate and irradiation on a second side of the substrate opposite the first side of the substrate. Such a deposition chamber may be a dual-function chamber capable of performing both a material deposition process and a thermal process on a substrate without removing the substrate from the chamber, thus eliminating the time needed to transport the substrate from a deposition chamber to a peripheral thermal treatment chamber. The deposition chamber has an optical energy assembly (e.g., lamps) positioned at a peripheral region of the deposition chamber, and one or more chamber components having one or more reflective surfaces (e.g., the adapter plate and the edge ring) focus optical and/or radiant energy toward the backside of the substrate. In particular, a coating is disposed on a portion of the edge ring to provide one of the one or more reflective surfaces. The coating may comprise a metallic material that is applied ex-situ by a coating process or in-situ during a sputter deposition process in the deposition chamber. Embodiments of the invention take advantage of the elevated temperature of the thermal process by allowing the optical and/or radiant energy to impinge the coating in order to increase the reflectivity of the coating and reflect the optical and/or radiant energy to the backside of the substrate where the energy may be easily absorbed. Further, the geometry of the edge ring improves the angle of incidence of the reflected energy in order to facilitate control of the reflected energy and thus control of the temperature of the substrate.

While the foregoing is directed to embodiments of the invention, other and further embodiments of the invention may be devised without departing from the basic scope thereof.

What is claimed is:

1. An edge ring, comprising:
   an annular body having an inner peripheral edge, a first surface, and a second surface opposite the first surface;
   a first raised member adjacent the inner peripheral edge that extends substantially orthogonally from the first surface;
   a second raised member extending from the second surface adjacent the first raised member and separated from the first raised member by a first depression having a planar surface parallel to the first surface that directly intersects with a sloped surface of the second raised member; and
   a third raised member extending from the second surface adjacent the second raised member and separated by a second depression, the second depression comprising a tapered planar surface having a reflectivity value that is different than a reflectivity value of the first surface, the tapered planar surface providing an angle of incidence configured to direct optical energy radially inward along an entirety of the tapered planar surface, wherein the tapered planar surface is oriented at an angle of about 15 degrees to about 25 degrees relative to a plane of the first surface; and wherein the second raised member and the third raised member both extend above the first raised member, and the second raised member and the third raised member extend to a substantially equal height.

2. The edge ring of claim 1, wherein the annular body comprises a ceramic material.

3. The edge ring of claim 2, wherein the tapered planar surface is coated with a metallic material.

4. The edge ring of claim 3, wherein the metallic material is a copper containing material.

5. The edge ring of claim 2, wherein the tapered planar surface includes a mean surface roughness of about 75 Ra to about 120 Ra.

6. The edge ring of claim 2, wherein the second depression and the tapered planar surface includes a mean surface roughness of about 75 Ra to about 120 Ra.

7. The edge ring of claim 2, wherein the second surface includes a mean surface roughness of about 75 Ra to about 120 Ra between the first depression and a third raised member.

8. The edge ring of claim 1, wherein the annular body comprises a sintered ceramic material and the tapered planar surface comprises a coating comprising a copper containing material.

9. The edge ring of claim 1, further comprising a plurality of extensions disposed on the inner peripheral edge of the annular body.

10. An edge ring, comprising:
an annular body having an inner peripheral edge, a first surface, and a second surface opposite the first surface;
a first raised member extending from the second surface defining a planar surface intersecting with the inner peripheral edge;
a second raised member extending from the second surface radially outward of the first raised member and separated from the first raised member by a first depression, the first depression having a planar surface parallel to the first surface that directly intersects with a sloped surface of the second raised member;
a third raised member extending from the second surface radially outward of the second raised member and separated by a second depression having a planar surface disposed along a distance between the second raised member and the third raised member, the planar surface being disposed at an acute angle relative to the plane of the first surface, wherein the acute angle is about 15 degrees to about 25 degrees relative to the plane of the first surface; and
a recessed flange disposed radially outward of the third raised member, the recessed flange comprising a surface that is parallel to a plane of the first surface and substantially orthogonal to an outer peripheral surface of the annular body, and
wherein the second raised member and the third raised member both extend above the first raised member, and the second raised member and the third raised member extend to a substantially equal height.

11. The edge ring of claim 10, wherein the planar surface comprises a reflectivity value that is different than a reflectivity value of the first surface.

12. The edge ring of claim 10, wherein the planar surface includes a mean surface roughness of about 75 Ra to about 120 Ra.

13. The edge ring of claim 10, wherein an area between the first depression and an apex of the third raised member includes a mean surface roughness of about 75 Ra to about 120 Ra.

14. The edge ring of claim 10, wherein the planar surface is coated with a metallic material.

15. An edge ring, comprising:
an annular body having an inner peripheral edge, a first surface, and a second surface opposite the first surface;
a first raised member extending orthogonally from the first surface defining a planar surface intersecting with the inner peripheral edge that is substantially parallel to the first surface;
a second raised member extending from the second surface radially outward of the first raised member and separated from the first raised member by a first depression, the second raised member having a first side and a second side, and the first depression has a planar surface parallel to the first surface that directly intersects with a sloped surface of the first side;
a third raised member extending from the second surface radially outward of the second raised member and separated by a second depression, the second depression comprising a planar surface disposed along a distance between the second raised member and the third raised member, the planar surface being disposed in a plane having an angle that is substantially normal to a surface of the second side of the second raised member, wherein the planar surface is oriented an angle is about 15 degrees to about 25 degrees relative to the plane of the first surface; and
a recessed flange disposed radially outward of the third raised member, the recessed flange comprising a surface that is substantially orthogonal to an outer peripheral surface of the body, and
wherein the second raised member and the third raised member both extend above the first raised member, and the second raised member and the third raised member extend to a substantially equal height.

16. The edge ring of claim 15, wherein the planar surface is coated with a metallic material.

17. The edge ring of claim 15, wherein an area between the first depression and an apex of the third raised member includes a mean surface roughness of about 75 Ra to about 120 Ra.

18. The edge ring of claim 17, wherein the area is coated with a metallic material.

* * * * *